(12) United States Patent
Wu et al.

(10) Patent No.: US 12,389,735 B2
(45) Date of Patent: Aug. 12, 2025

(54) STACKED PHOTOVOLTAIC DEVICE

(71) Applicant: LONGI GREEN ENERGY TECHNOLOGY CO., LTD., Shaanxi (CN)

(72) Inventors: Zhao Wu, Shaanxi (CN); Chen Xu, Shaanxi (CN); Zifeng Li, Shaanxi (CN); Junjie Xie, Shaanxi (CN); Tong Liu, Shaanxi (CN)

(73) Assignee: LONGI GREEN ENERGY TECHNOLOGY CO., LTD., Shaanxi (CN)

(*) Notice: Subject to any disclaimer, the term of this patent is extended or adjusted under 35 U.S.C. 154(b) by 17 days.

(21) Appl. No.: 18/686,581

(22) PCT Filed: May 26, 2022

(86) PCT No.: PCT/CN2022/095201
§ 371 (c)(1),
(2) Date: Feb. 26, 2024

(87) PCT Pub. No.: WO2023/024620
PCT Pub. Date: Mar. 2, 2023

(65) Prior Publication Data
US 2024/0373657 A1    Nov. 7, 2024

(30) Foreign Application Priority Data

Aug. 27, 2021   (CN) .......................... 202111000183.3

(51) Int. Cl.
*H10K 30/84*   (2023.01)
*H10K 30/57*   (2023.01)

(52) U.S. Cl.
CPC ............. *H10K 30/84* (2023.02); *H10K 30/57* (2023.02)

(58) Field of Classification Search
CPC ............................... H10K 30/84; H10K 30/57
See application file for complete search history.

(56) References Cited

U.S. PATENT DOCUMENTS

2017/0271622 A1   9/2017   Chaudhari
2020/0058819 A1*  2/2020   Kirner ................... H10F 77/122

FOREIGN PATENT DOCUMENTS

| CN | 110521008 A | 11/2019 |
| CN | 113257940 A | 8/2021 |
| JP | 2011014635 A | 1/2011 |

OTHER PUBLICATIONS

Gong (Highly Efficient Perovskite Solar Cells with Gradient Bilayer Electron Transport Materials), Nano Lett. 2018, 18, 3969-3977 (Year: 2018).*

(Continued)

*Primary Examiner* — Devina Pillay
(74) *Attorney, Agent, or Firm* — Hodgson Russ LLP (57) ABSTRACT

A tandem photovoltaic device includes a perovskite absorbing layer, a crystalline silicon absorbing layer and a single-layer electrical function layer connected in series to the two absorbing layers; a contact interface between the perovskite absorbing layer and the single-layer electrical function layer is a first series interface; and a contact interface between the crystalline silicon absorbing layer and the single-layer electrical function layer is a second series interface; wherein a conducting type at the second series interface is different from a conducting type at the first series interface, and the difference between the work functions is ≥−0.3 eV and ≤0.3 eV.

10 Claims, 3 Drawing Sheets

(56) References Cited

OTHER PUBLICATIONS

Zheng (Large area efficient interface layer free monolithic perovskite/homo-junction-silicon tandem solar cell with over 20% efficiency), Energy Environ. Sci., 2018, 11, 2432-2443 (Year: 2018).*
WIPO, International Search Report for PCT/CN2022/095201, Aug. 10, 2022.

* cited by examiner

STACKED PHOTOVOLTAIC DEVICE

CROSS-REFERENCE TO RELATED APPLICATIONS

The present application is a national phase entry under 35 U.S.C. § 371 of International Application No. PCT/CN2022/095201, filed May 26, 2022, which claims priority to Chinese Patent Application No. 202111000183.3, filed Aug. 27, 2021, the entire disclosures of which are incorporated herein in by reference.

TECHNICAL FIELD

The present disclosure relates to the technical field of solar photovoltaic and, more particular, to a tandem photovoltaic device.

BACKGROUND

A two-terminal two-junction tandem structure formed by stacking a wide band gap perovskite device on a crystalline silicon device is adopted by the tandem photovoltaic device, so that the theoretical limit of about 29.4% of power conversion efficiency (PCE) of the crystalline silicon device is anticipated to be broken, and a photovoltaic device with power conversion efficiency exceeding 30% is obtained.

At present, the upper and lower cells of a tandem cell are often connected in series by using multilayer electrical function layers. Although the functions of energy band buffering, carrier transmission and composite series connection are achieved by using this series method, higher parasitic absorption is also caused by using this series method, and the multi-interface superimposed by multilayer electrical function layers may introduce more interface resistance and defect loss, resulting in current loss. In addition, the tandem photovoltaic device is a series stack structure of the crystalline silicon and the perovskite device. The theoretical voltage value should be the sum of the output voltages of the two devices, but the actual situation is that there is a voltage loss so that the actual output voltage is lower than the theoretical voltage.

Therefore, how to reduce the current and voltage loss of the tandem photovoltaic devices is the key to further improve the power conversion efficiency of tandem photovoltaic devices.

SUMMARY

A tandem photovoltaic device is provided by the present disclosure, which aims at reducing the current and voltage loss of the tandem photovoltaic device and further improving the power conversion efficiency of the tandem photovoltaic device.

In a first aspect, a tandem photovoltaic device is provided by the embodiments of the present disclosure, wherein the tandem photovoltaic device includes a perovskite absorbing layer, a crystalline silicon absorbing layer, and a single-layer electrical function layer connected in series to the perovskite absorbing layer and the crystalline silicon absorbing layer;
  wherein a conducting type of the crystalline silicon absorbing layer at the second series interface is different from a conducting type of the perovskite absorbing layer at the first series interface; and
  a difference between a work function of the crystalline silicon absorbing layer at the second series interface and a work function of the perovskite absorbing layer at the first series interface is $\geq -0.3$ eV and $\leq 0.3$ eV.

Optionally, a work function of the single-layer electrical function layer is located within a range between a first work function and a second work function and including the first work function and the second work function;
  the first work function is a work function of the perovskite absorbing layer at the first series interface on the perovskite absorbing layer; and
  the second work function is a work function of the crystalline silicon absorbing layer at the second series interface on the crystalline silicon absorbing layer.

Optionally, an electrical conductivity of the single-layer electrical function layer is greater than or equal to a maximum of a first electrical conductivity and a second electrical conductivity;
  the first electrical conductivity is an electrical conductivity of the perovskite absorbing layer at the first series interface on the perovskite absorbing layer; and
  the second electrical conductivity is an electrical conductivity of the crystalline silicon absorbing layer at the second series interface on the crystalline silicon absorbing layer.

Optionally, a band gap width of a perovskite material used for the perovskite absorbing layer is 1.5 eV to 2.3 eV.

Optionally, the tandem photovoltaic device further includes at least one of a first interface passivation layer and a second interface passivation layer;
  a thickness of the first interface passivation layer is less than or equal to 5 nm, and the first interface passivation layer is located between the perovskite absorbing layer and the single-layer electrical function layer; and
  a thickness of the second interface passivation layer is less than or equal to 5 nm, and the second interface passivation layer is located between the crystalline silicon absorbing layer and the single-layer electrical function layer.

Optionally, the tandem photovoltaic device further includes a first function layer, a second function layer, a first electrode and a second electrode;
  the first function layer is located at a side of the perovskite absorbing layer away from the single-layer electrical function layer; and the first electrode is penetrated through or at least partially inserted in the first function layer; and
  the second function layer is located at a side of the crystalline silicon absorbing layer away from the single-layer electrical function layer; and the second electrode is penetrated through or at least partially inserted in the second function layer.

Optionally, the conducting type of the crystalline silicon absorbing layer at the second series interface is P-type; an N-type perovskite material is used at the first series interface on the perovskite absorbing layer, wherein the N-type perovskite material includes at least one of $MAPbBr_3$, $MAPb_{0.91}I_{2.82}$, $MAPbI_3$, $FAPbI_3$, $MASnI_3$, $MANH_3PbI_3$, $MASnBr_3$, $FASnI_3$ and $CsSnBr_3$.

Optionally, an N-type dopant is further employed at the first series interface on the perovskite absorbing layer, wherein the N-type dopant includes at least one of indium, antimony, vanadium and bismuth.

Optionally, a material used for the single-layer electrical function layer includes any one or a doped material of any one of fluorine-doped tin oxide, nickel oxide, copper oxide, molybdenum oxide and 2,2',7,7'-tetrakis[N,N-di(4-methoxyphenyl)amino]-9,9'-spirobifluorene; and the doped material is obtained by doping with any one of an alkali metal element, an alkaline earth metal element, a transition metal element and a halogen metal element.

Optionally, the conducting type of the crystalline silicon absorbing layer at the second series interface is N-type; a P-type perovskite material is used at the first series interface on the perovskite absorbing layer, wherein the P-type perovskite material includes at least one of $MAPbBr_3$, $MAPb_{0.91}I_{2.82}$, $MAPbI_3$, $FAPbI_3$, $MASnI_3$, $MANH_3PbI_3$, $MASnBr_3$, $FASnI_3$ and $CsSnBr_3$.

Optionally, a P-type dopant is further employed at the first series interface on the perovskite absorbing layer, wherein the P-type dopant includes at least one of sodium, potassium, copper and oxygen.

Optionally, a material used for the single-layer electrical function layer includes any one or a doped material of any one of zinc oxide, tin oxide, titanium oxide and fullerene carbon; and the doped material is obtained by doping with any one of an alkali metal element, an alkaline earth metal element, a transition metal element and a halogen metal element.

The tandem photovoltaic device provided by the embodiments of the present disclosure includes a perovskite absorbing layer, a crystalline silicon absorbing layer, and a single-layer electrical function layer connected in series to the perovskite absorbing layer and the crystalline silicon absorbing layer, a contact interface between the perovskite absorbing layer and the single-layer electrical function layer is a first series interface, and a contact interface between the crystalline silicon absorbing layer and the single-layer electrical function layer is a second series interface, wherein a conducting type of the crystalline silicon absorbing layer at the second series interface is different from a conducting type of the perovskite absorbing layer at the first series interface; and a difference between a work function of the crystalline silicon absorbing layer at the second series interface and a work function of the perovskite absorbing layer at the first series interface is $\geq -0.3$ eV and $\leq 0.3$ eV. The difference of the work functions between the perovskite absorbing layer and the crystalline silicon absorbing layer of the tandem photovoltaic device provided by the embodiment of the present disclosure at the contact interface is $\geq -0.3$ eV and $\leq 0.3$ eV. Therefore, that the work functions between the perovskite absorbing layer and the crystalline silicon absorbing layer are matched may be achieved to avoid the voltage loss caused by the mismatching of the work functions. Furthermore, based on the matching of the work functions, the energy band structures of the perovskite absorbing layer and the crystalline silicon absorbing layer are matched, without a need to perform energy level buffering. The single-layer electrical function layer may be used to connect the two absorbing layers in series, the parasitic absorption of multi-layer series is reduced. The resistance and interface loss induced by the interfaces between the multi-layers are reduced, and the current and voltage losses are reduced, so that the output voltage of the tandem photovoltaic device is improved, and the power conversion efficiency of the tandem photovoltaic device is further improved.

BRIEF DESCRIPTION OF THE DRAWINGS

In order to more clearly illustrate the technical solutions in the embodiments of the present disclosure, the drawings to be used in the description of the embodiments will be briefly introduced below. Obviously, the drawings in the description below are only some embodiments of the present disclosure. It will be apparent to those skilled in the art to obtain other drawings according to these drawings without involving any inventive effort.

DETAILED DESCRIPTION OF THE EMBODIMENTS

The technical solutions in the embodiments of the application will be described clearly and completely in conjunction with the accompanying drawings in the examples of the application below. Obviously, the described embodiments are only a part of the embodiments of the present application, rather than all of the embodiments. Based on the embodiments in the present disclosure, all other embodiments obtained by a person skilled in the art without involving any inventive effort are within the scope of protection of the present disclosure.

Figure 1:
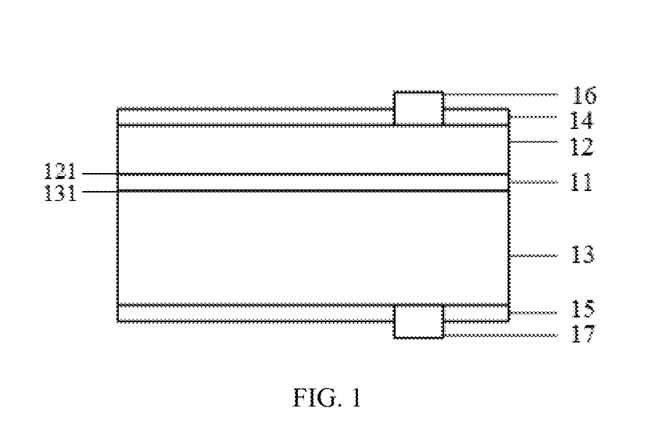
FIG. 1 shows a schematic diagram of a structure of a tandem photovoltaic device according to an embodiment of the present disclosure.

FIG. 1 shows a schematic diagram of a structure of a tandem photovoltaic device according to an embodiment of the present disclosure. With reference to FIG. 1, the tandem photovoltaic device includes a perovskite absorbing layer 12, a crystalline silicon absorbing layer 13, and a single-layer electrical function layer 11 connected in series to the perovskite absorbing layer 12 and the crystalline silicon absorbing layer 13. A first series interface 121 on the perovskite absorbing layer 12 is a first series interface 121, and a second series interface 131 on the crystalline silicon absorbing layer 13 is a second series interface 131;

wherein a conducting type of the crystalline silicon absorbing layer 13 at the second series interface 131 is different from a conducting type of the perovskite absorbing layer 12 at the first series interface 121; and a difference between a work function of the crystalline silicon absorbing layer 13 at the second series interface 131 and a work function of the perovskite absorbing layer 12 at the first series interface 121 is ≥−0.3 eV and ≤0.3 eV.

In the embodiments of the present disclosure, the crystalline silicon absorbing layer 13 and the perovskite absorbing layer 12 are connected in series via the single-layer electrical function layer 11. Thus, the interface on the perovskite absorbing layer 12 and connected in series to the single-layer electrical function layer 11 is a first series interface 121, and the interface on the crystalline silicon absorbing layer 13 and connected in series to the single-layer electrical function layer 11 is a second series interface 131. It is found after studying the tandem photovoltaic device that an energy level p-$E_c$ of the perovskite absorbing layer 12 at the first series interface 121 splits under light conditions to generate an electron quasi-Fermi level of a p-qusi-$E_c$ perovskite absorbing layer and a hole quasi-Fermi level of a p-qusi-$E_h$ perovskite absorbing layer. An energy level s-$E_v$ of the crystalline silicon absorbing layer 13 at the second series interface 131 splits under light conditions to generate an electron quasi-Fermi level of the s-qusi-$E_c$ crystalline silicon absorbing layer and a hole quasi-Fermi level of the s-qusi-$E_h$ crystalline silicon absorbing layer. Under the same material and illumination conditions, the difference p-FS (fermi level splitting) between the p-qusi-$E_c$ and the p-qusi-$E_h$ and the difference s-FS between s-qusi-$E_c$ and s-qusi-$E_h$ are a constant value. At this moment, when the energy level difference of the tandem photovoltaic device $\Delta E=(p-E_c)-(s-E_v)$, then the open circuit voltage Voc=(s-qusi-$E_e$)−(p-qusi-$E_h$)=(p-FS)+(s-FS)−$\Delta$qusi-E≈(p-FS)+(s-FS)−$\Delta E$. Since p-FS and s-FS are fixed values, the magnitude of the Voc is closely related to $\Delta E$. The smaller $\Delta E$ is, the larger Voc is. Further, when the work function of the perovskite absorbing layer 12 at the first series interface 121 is mismatched with the work function of the crystalline silicon absorbing layer 13 at the second series interface 131, $\Delta E$ is larger, thus a smaller Voc is resulted in, i.e., the mismatching of the work functions in the tandem photovoltaic device results in a voltage loss. At the same time, when the mismatching of the work functions is large, $\Delta E$ is larger. The interface barrier may be generated. It is necessary to introduce multilayer electrical function layers to buffer the carrier energy level and reduce the interface barrier, the thickness of the series structure is increased, the resistivity and transmittance of the intermediate series structure are affected, the parasitic absorption is caused, and current and voltage losses is further led to.

In the embodiment of the present disclosure, in order to avoid the mismatching of the work functions of the two absorbing layers, the work functions of the first series interface 121 and the second series interface 131 may be adjusted. Optionally, since the energy band structure of the crystalline silicon absorbing layer 13 is relatively fixed, the work function of the P-type crystalline silicon is 5.03 eV-5.10 eV, and the work function of the N-type crystalline silicon is 4.42 eV-4.63 eV. Therefore, with the work function of the crystalline silicon material as a reference, the work function of the perovskite absorbing layer 12 at the first series interface 121 may be adjusted so that the difference between the work function of the crystalline silicon absorbing layer 13 at the second series interface 131 and the work function of the perovskite absorbing layer 12 at the first series interface 121 is ≥−0.3 eV and ≤0.3 eV. Thus, the matching of the work functions is realized and the matching of the energy band structures is realized, and then the crystalline silicon absorbing layer 13 and the perovskite absorbing layer 12 may be connected in series by using the single-layer electrical function layer 11, and the voltage loss from excessive $\Delta E$ and small open circuit voltage caused by the work function mismatch may be avoided.

Figure 2:
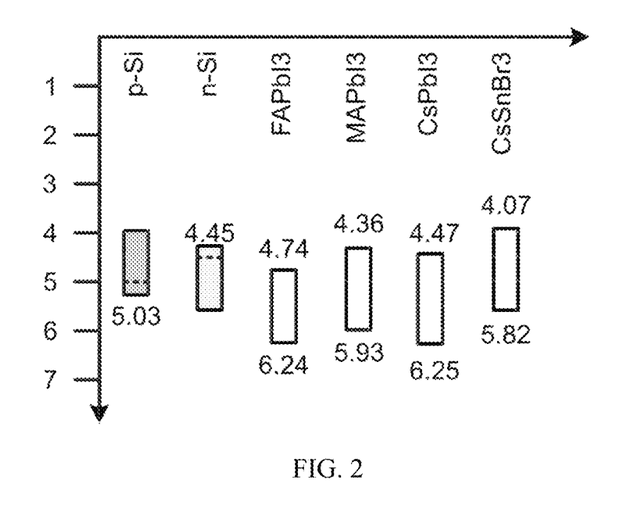
FIG. 2 shows a schematic diagram of work function values and band gap ranges of the crystalline silicon and a part of the perovskite material according to an embodiment of the present disclosure.

FIG. 2 shows a schematic diagram of work function values and band gap ranges of the crystalline silicon and a part of the perovskite material according to an embodiment of the present disclosure. As shown in FIG. 2, the ordinate is the energy value, in eV, and the abscissa is the material type, wherein the column corresponding to each material type represents the band gap range, and the values corresponding to the P-type and N-type crystalline silicon materials represent the work function. Thus, the work function of the P-type crystalline silicon in the crystalline silicon is about 5.03 eV, the work function of the N-type crystalline silicon is about 4.45 eV, and the values corresponding to the other perovskite materials respectively represent band edge values of a conduction band and a valence band. The work function of the perovskite material is usually located within the band gap and may be conveniently adjusted. As shown in FIG. 2, in some perovskite materials, the maximum adjustable range of the work function of $FAPbI_3$ is 4.74 eV-6.24 eV. The maximum adjustable range of the work function of $MAPbCl_3$ is 4.36 eV-5.93 eV. The maximum adjustable range of the work function of $CsPbI_3$ is 4.47 eV-6.25 eV. The maximum adjustable range of the work function of $CsSnBr_3$ is 4.07 eV-5.82 eV, etc. It can be seen that the work function of the crystalline silicon is relatively fixed, while the work function of the perovskite material may be adjusted in a certain range. Taking the work function of the crystalline silicon as a reference, the work function of the perovskite material may be adjusted so as to achieve the matching of the work functions of the crystalline silicon absorbing layer and the perovskite absorbing layer. The work functions shown in FIG. 2 are data when each material exists independently. Since the work functions of each material may change due to the contact in the tandem structure, and at the same time, the work functions of multilayer materials are not easy to be accurately determined, only the values of the work functions when the materials exist independently are considered here. In addition, the type of the perovskite material in FIG. 2 is merely an example, and does not limit the material selection of the perovskite absorbing layer in the embodiment of the present disclosure.

Since the perovskite absorbing layer 12 may have different conducting types and work functions at various places due to different doping element concentrations, types, etc., the crystalline silicon absorbing layer 13 may have different conducting types at various places due to silicon wafer types, doping types, doping positions, etc. Therefore, the conducting type and work function at the first series interface 121 between the perovskite absorbing layer 12 and the single-layer electrical function layer 11 may be regulated, and the conducting type at the second series interface 131 between the crystalline silicon absorbing layer 13 and the single-layer electrical function layer 11 may be regulated. When the work function of the perovskite absorbing layer 12 at the first series interface 121 is regulated, in the range of work functions achievable by different perovskite materials, for example, when the conducting type of the crystalline silicon absorbing layer 13 at the second series interface 131 is P-type, the work function is 5.03 eV. At this moment, the work function of the perovskite absorbing layer 12 at the first series interface 121 may be adjusted to be 5.03±0.3 eV, so that the difference of the work functions is ≥−0.3 eV and ≤0.3 eV. When the conducting type of the crystalline silicon absorbing layer 13 at the second series interface 131 is N-type, the work function is 4.45 eV. At this moment, the work function of the perovskite absorbing layer 12 at the first series interface 121 may be adjusted to be 4.45±0.3 eV, so that the difference of the work functions is ≥−0.3 eV and ≤0.3 eV. The above-mentioned values of the work functions are merely for example, and within the allowable range, a person skilled in the art may select the work functions of the specific crystalline silicon absorbing layer 13 and the perovskite absorbing layer 12 at the contact interface according to requirements. Also, in the perovskite absorbing layer, a bipolar perovskite absorbing layer with the Fermi level located in the middle of the band gap is not included.

Figure 3A:
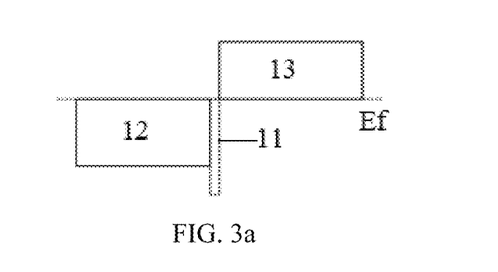
FIG. 3a shows a schematic diagram of matching of the energy band structure of a P-type crystalline silicon absorbing layer connected in series to an N-type perovskite absorbing layer according to an embodiment of the present disclosure.
Figure 3B:
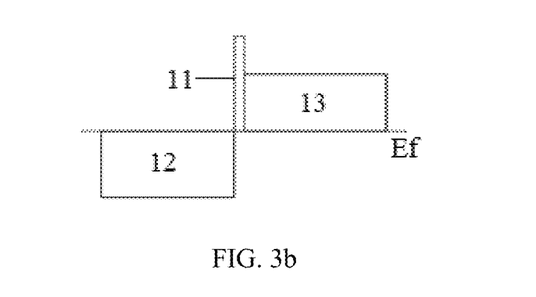
FIG. 3b shows a schematic diagram of matching of the energy band structure of another P-type crystalline silicon absorbing layer connected in series to an N-type perovskite absorbing layer according to an embodiment of the present disclosure.
Figure 3C:
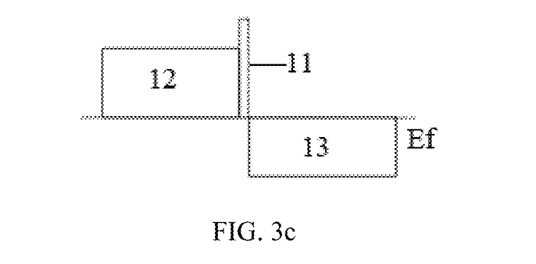
FIG. 3c shows a schematic diagram of matching of the energy band structure of an N-type crystalline silicon absorbing layer connected in series to a P-type perovskite absorbing layer according to an embodiment of the present disclosure.
Figure 3D:
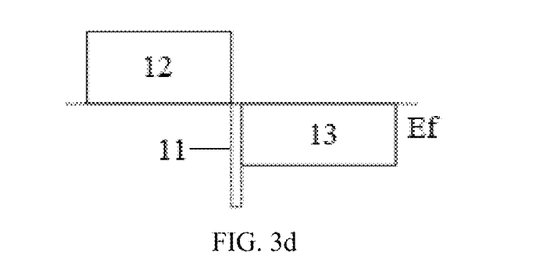
FIG. 3d shows a schematic diagram of matching of the energy band structure of another N-type crystalline silicon absorbing layer connected in series to a P-type perovskite absorbing layer according to an embodiment of the present disclosure.

FIG. 3a shows a schematic diagram of matching of the energy band structure of a P-type crystalline silicon absorbing layer connected in series to an N-type perovskite absorbing layer according to an embodiment of the present disclosure; FIG. 3b shows a schematic diagram of matching of the energy band structure of another P-type crystalline silicon absorbing layer connected in series to an N-type perovskite absorbing layer according to an embodiment of the present disclosure; FIG. 3c shows a schematic diagram of matching of the energy band structure of an N-type crystalline silicon absorbing layer connected in series to a P-type perovskite absorbing layer according to an embodiment of the present disclosure; FIG. 3d shows a schematic diagram of matching of the energy band structure of another N-type crystalline silicon absorbing layer connected in series to a P-type perovskite absorbing layer according to an embodiment of the present disclosure. Wherein, the vacuum energy level is 0. When going downwards, the positions of the energy levels include the energy band structures of a single-layer electrical function layer 11, a perovskite absorbing layer 12 and a crystalline silicon absorbing layer 13, such as the energy band structures shown in FIGS. 3a and 3c, wherein the single-layer electrical function layer 11 functions in series by realizing a tunneling recombination mechanism at the contact interface with the crystalline silicon absorbing layer 13. As shown in the energy band structures in FIGS. 3b and 3d, the tunneling recombination occurs at the series interface between the single-layer electrical function layer 11 and the perovskite absorbing layer 12. Since the electrical conductivity of the crystalline silicon absorbing layer 13 is generally higher than the electrical conductivity of the perovskite absorbing layer 12, the output effect may be limited by the carrier mobility in the perovskite material as shown in the energy band structure in FIGS. 3b and 3d. In FIGS. 3a, 3b, 3c, 3d, a series effect may be achieved by the single-layer electrical function layer 1 due to that the matching of the energy band structures between the crystalline silicon absorbing layer 13 and the perovskite absorbing layer 12 is achieved.

Optionally, the work function of the single-layer electrical function layer 11 is located within a range between a first work function and a second work function and including the first work function and the second work function.

The first work function is a work function of the perovskite absorbing layer 12 at the first series interface 121 on the perovskite absorbing layer 12.

The second work function is a work function of the crystalline silicon absorbing layer 13 at the second series interface 131 on the crystalline silicon absorbing layer 13.

In the embodiments of the present disclosure, the single-layer electrical function layer 11 functions in series between the perovskite absorbing layer 12 and the crystalline silicon absorbing layer 13. Therefore, a material with a work function located within a range between a first work function and a second work function and including the first work function and the second work function may be selected to be used as the single-layer electrical function layer 11, wherein the first work function is the work function of the perovskite absorbing layer 12 at the first series interface 121, and the second work function is the work function of the crystalline silicon absorbing layer 13 at the second series interface 131. Specifically, when the first work function is 5.03 eV and the second work function is 5.03±0.3 eV, in the case where the specific value of the second work function is greater than the first work function, the upper limit of the value of the work function of the single-layer electrical function layer 11 is the specific value of the second work function, and the lower limit is 5.03 eV. In the case where the specific value of the second work function is less than the first work function, the upper limit of the value of the work function of the single-layer electrical function layer 11 is 5.03 eV, and the lower limit is the specific value of the second work function. The case where the first work function is 4.45 eV and the second work function is 4.45±0.3 eV may be referred to above description, wherein the range of values of the work function of the single-layer electrical function layer 11 includes the end values.

Optionally, the electrical conductivity of the single-layer electrical function layer 11 is greater than or equal to a maximum of a first electrical conductivity and a second electrical conductivity;

the first electrical conductivity is an electrical conductivity of the perovskite absorbing layer 12 at the first series interface 121 on the perovskite absorbing layer 12; and the second electrical conductivity is an electrical conductivity of the crystalline silicon absorbing layer 13 at the second series interface 131 on the crystalline silicon absorbing layer 13.

In the embodiments of the present disclosure, the electrical conductivity of the single-layer electrical function layer 11 may be greater than or equal to a maximum value of the first electrical conductivity at the position of the contact interface with the crystalline silicon absorbing layer 13 and the second electrical conductivity at the position of the contact interface with the perovskite absorbing layer 12. Optionally, the electrical conductivity of the material at the contact interface may be determined according to the type, composition, etc. of the material, and the electrical conductivity of the material are regarded as the first electrical conductivity and the second electrical conductivity, the first electrical conductivity and the second electrical conductivity are compared to determine that the electrical conductivity of the single-layer electrical function layer 11 is greater than or equal to the maximum value of the first electrical conductivity and the second electrical conductivity. In practical applications, since the electrical conductivity of the crystalline silicon material is generally higher than the electrical conductivity of the perovskite material, the single-layer electrical function layer 11, as in the previous FIGS. 3b, 3d, is prevented from affecting the contact and transmission capacity of the carriers of the perovskite absorbing layer 12, the series connection is achieved by a tunneling recombination mechanism at the contact interface between the perovskite absorbing layer and the crystalline silicon absorbing layer 13.

Optionally, a crystalline silicon material that has light absorption and photo-generated carriers may be separated and collected is used as the crystalline silicon absorbing layer 13.

In the embodiments of the present disclosure, the crystalline silicon absorbing layer 13 may be used as a lower cell absorbing layer of the tandem photovoltaic device. The crystalline silicon absorbing layer 13 may or may not include a PN junction, and the upper and lower surfaces of the crystalline silicon absorbing layer may have a planar structure, and may also have a light trapping structure, etc. Optionally, a crystalline silicon material that has the effect of light absorption and photo-generated carriers may be separated and collected, such as a crystalline silicon material locally and fully doped on the surface of a silicon wafer may be used as the crystalline silicon absorbing layer 13, this crystalline silicon material may play a role in light absorption and provide separable photo-generated carriers, and contribute to the power conversion efficiency of the tandem photovoltaic device. However, a microcrystalline silicon or nanocrystalline silicon layer on a passivation layer such as an amorphous silicon, a TOPCon (tunnel oxide passivated contact) cell or the like may absorb incident light, but the generated photo-generated carriers cannot be separated and collected. Therefore, the microcrystalline silicon or nanocrystalline silicon layer on the passivation layer is not used as a material of the single-layer electrical function layer 11.

Optionally, a band gap width of a perovskite material used for the perovskite absorbing layer 12 is 1.5 eV to 2.3 eV.

In the embodiments of the present disclosure, the perovskite absorbing layer 12 may be used as an upper cell absorbing layer of the tandem photovoltaic device, wherein a wide band gap perovskite material with a band gap width of 1.5 eV-2.3 eV may be used as the perovskite absorbing layer 12, a single component perovskite material may be used, and a mixed component perovskite material may also be used. A uniform component may be used as the perovskite material in the perovskite absorbing layer 12, and a non-uniform component may also be used as the perovskite material in the perovskite absorbing layer 12, so that the work function of the perovskite absorbing layer 12 at the first series interface 121 is complied with the above-mentioned definition. The composition of the perovskite absorbing layer 12 away from the contact interface with the single-layer electrical function layer 11 is not particularly limited in the embodiments of the present disclosure.

Optionally, the conducting type of the crystalline silicon absorbing layer 13 at the second series interface 131 is P-type, and an N-type perovskite material is used at the first series interface 121 on the perovskite absorbing layer 12, wherein the N-type perovskite material includes at least one of $MAPbBr_3$, $MAPb_{0.91}I_{2.82}$, $MAPbI_3$, $FAPbI_3$, $MASnI_3$, $MANH_3PbI_3$, $MASnBr_3$, $FASnI_3$ and $CsSnBr_3$.

In the embodiments of the present disclosure, the conducting type of the crystalline silicon absorbing layer 13 at the second series interface 131 and the conducting type and work function of the perovskite absorbing layer 12 at the first series interface 121 are regulated, and the conducting type and work function at other positions on the crystalline silicon absorbing layer 13 and the perovskite absorbing layer 12 are not limited. For example, when the conducting type at the second series interface 131 is P-type, the conducting type at other positions on the crystalline silicon absorbing layer 13 may be P-type or N-type. For example, N-type doping is performed at the second series interface 131 of the P-type silicon wafer. In a similar way, when the conducting type at the first series interface 121 is P-type, the conducting type at other positions of the perovskite absorbing layer 12 may be P-type or N-type, and the embodiments of the present disclosure do not specifically limit this.

In the embodiments of the present disclosure, when the conducting type at the second series interface 131 is P-type, a single component or two or more mixed components of perovskite materials such as $FAPbI_3$, $MAPb_{1.1}I_{3.2}$, $MAPb_{1.5}Br_4$, $MASnI_3$, $MAPbBr_{1.5}Cl_{1.5}$, $MAPbCl_3$, $MAPbI_3$, $MAPbI_{2.1}Cl_{0.9}$, $FASnI_3$ and $CsSnI_3$ may be used at the first series interface 121. By adjusting the species and the proportional relationship of various atoms in the perovskite materials, the perovskite absorbing layer 12 is N-type at the first series interface 121, and the difference between the work function of the perovskite absorbing layer 12 at the first series interface 121 and the work function of the crystalline silicon absorbing layer 13 at the second series interface 131 is ≥−0.3 eV and ≤0.3 eV.

Optionally, an N-type dopant is further employed at the first series interface 121 on the perovskite absorbing layer 12, wherein the N-type dopant includes at least one of indium, antimony, vanadium and bismuth.

In an embodiment of the present disclosure, an N-type dopant may also be used at the first series interface 121, so as to better regulate that the first series interface 121 in series is N-type when it is P-type at the second series interface 131, wherein the N-type dopant may be at least one of indium, antimony, vanadium and bismuth.

The material used for the single-layer electrical function layer 11 includes any one or a doped material of any one of tin oxide, nickel oxide, copper oxide, molybdenum oxide, 2,2',7,7'-tetrakis [N,N-di(4-methoxyphenyl)amino]-9,9'-spirobifluorene, cuprous oxide, tungsten oxide, vanadium oxide, poly[bis(4-phenyl)(2,4,6-trimethylphenyl)amine], cuprous thiocyanate, poly(3,4-ethylene dioxythiophene), poly(3,4-ethylene dioxythiophene)-polystyrene sulfonic acid; and the doped material is obtained by doping with any one of an alkali metal element, an alkaline earth metal element, a transition metal element and a halogen metal element.

In the embodiments of the present disclosure, based on the requirements of parameters such as work function and electrical conductivity, when the second series interface 131 of the crystalline silicon absorbing layer 13 is P-type and the first series interface 121 of the perovskite absorbing layer 12 is N-type, the materials which may be used for the single-layer electrical function layer 11 include any one or a doped material of any one of tin oxide, nickel oxide, copper oxide, molybdenum oxide, 2,2',7,7'-tetrakis[N,N-di(4-methoxyphenyl)amino]-9,9'-spirobifluorene(Spiro-OMeTAD), cuprous oxide, tungsten oxide, vanadium oxide, poly[bis(4-phenyl)(2,4,6-trimethylphenyl)amine] (PTAA), cuprous thiocyanate, poly(3,4-ethylenedioxythiophene) (PEDOT), poly(3,4-ethylene dioxythiophene)-polystyrene sulfonic acid (PEDOT: PSS), wherein the doped material of any one refers to a material obtained by doping any one of tin oxide, nickel oxide, copper oxide, molybdenum oxide, 2,2',7,7'-tetrakis[N,N-di(4-methoxyphenyl)amino]-9,9'-spirobifluorene, cuprous oxide, tungsten oxide, vanadium oxide, poly[bis(4-phenyl)(2,4,6-trimethylphenyl)amine], cuprous thiocyanate, poly(3,4-ethylene dioxythiophene), poly(3,4-ethylene dioxythiophene)-polystyrene sulfonic acid with other elements. Optionally, the doped material may be doped with any one of an alkali metal element, an alkaline earth metal element, a transition metal element and a halogen metal element, such as sodium, calcium, indium, gallium, fluorine and other elements, and the work functions of the above-mentioned materials are similar. A person skilled in the art may select different types of materials according to process conditions, application requirements, etc., and which is not specifically limited by the embodiments of the present disclosure.

Optionally, the conducting type of the crystalline silicon absorbing layer 13 at the second series interface 131 is N-type, and a P-type perovskite material is used at the first series interface 121 on the perovskite absorbing layer 12, wherein the P-type perovskite material includes at least one of $MAPbBr_3$, $MAPb_{0.91}I_{2.82}$, $MAPbI_3$, $FAPbI_3$, $MASnI_3$, $MANH_3PbI_3$, $MASnBr_3$, $FASnI_3$ and $CsSnBr_3$.

In the embodiments of the present disclosure, when the conducting type at the second series interface 131 is N-type. A single component or two or more mixed components of perovskite materials such as $MAPbBr_3$, $MAPb_{0.91}I_{2.82}$, $MAPbI_3$, $FAPbI_3$, $MASnI_3$, $MANH_3PbI_3$, $MASnBr_3$, $FASnI_3$ and $CsSnBr_3$ may be used at the first series interface 121. The first series interface 121 of the perovskite absorbing layer 12 is P-type by adjusting the species and proportion relationship of various atoms in the perovskite material, and the difference between the work function of the perovskite absorbing layer at first series interface and the work function of the crystalline silicon absorbing layer 13 at the second series interface 131 is ≥−0.3 eV and ≤0.3 eV.

Optionally, a P-type dopant is further employed at the first series interface 121 on the perovskite absorbing layer 12, wherein the P-type dopant includes at least one of sodium, potassium, copper and oxygen.

In an embodiment of the present disclosure, a P-type dopant may also be used at the first series interface 121, so as to better regulate that the first series interface 121 in series is P-type when it is N-type at the second series interface 131, wherein the P-type dopant may be at least one of sodium, potassium, copper and oxygen.

Optionally, the material used for the single-layer electrical function layer 11 includes any one or a doped material of any one of zinc oxide, indium oxide, tin oxide, titanium oxide, molybdenum sulfide, niobium oxide, tantalum oxide, cadmium sulfide, fullerene carbon; and the doped material is obtained by doping with any one of an alkali metal element, an alkaline earth metal element, a transition metal element and a halogen metal element.

In the embodiments of the present disclosure, when the second series interface 131 of the crystalline silicon absorbing layer 13 is N-type and the first series interface 121 of the perovskite absorbing layer 12 is P-type, the material which may be used for the single-layer electrical function layer 11 includes any one or a doped material of any one of zinc oxide, indium oxide, tin oxide, titanium oxide, molybdenum sulfide, niobium oxide, tantalum oxide, cadmium sulfide, fullerene carbon, wherein the doped material of any one refers to a material obtained by doping any one of zinc oxide, indium oxide, tin oxide, titanium oxide, molybdenum sulfide, niobium oxide, tantalum oxide, cadmium sulfide and fullerene carbon with other elements. Optionally, the doped material may be doped with any one of an alkali metal element, an alkaline earth metal element, a transition metal element and a halogen metal element, such as sodium, calcium, indium, gallium, fluorine and other elements, and the work functions of the above-mentioned materials are similar. A person skilled in the art may select different types of materials according to process conditions, application requirements, etc., and which is not specifically limited by the embodiments of the present disclosure.

Optionally, the tandem photovoltaic device further includes a first function layer 14, a second function layer 15, a first electrode 16 and a second electrode 17; and the first function layer 14 is located at a side of the perovskite absorbing layer 12 away from the single-layer electrical function layer 11; and the first electrode 16 is penetrated through or at least partially inserted in the first function layer 14.

In the embodiments of the present disclosure, the first function layer 14 may serve as an upper function layer of the surface of the perovskite absorbing layer 12, and is located at a side of the perovskite absorbing layer 12 away from the single-layer electrical function layer 11. The first function layer 14 is a multi-layer structure and may have at least one of functions such as interface passivation, selective contact and transmission, and upper surface anti-reflection. The first electrode 16 may be used as an upper electrode of the surface of the perovskite absorbing layer 12, wherein the first electrode 16 may be made of a metal or an alloy such as aluminum, copper, silver, etc. Optionally, the first electrode 16 is penetrated through or at least partially inserted in the first function layer 14. For example, the first electrode 16 may be partially embedded in the first function layer 14, and may also be penetrated through the first function layer 14, thus carriers are led out to realize external output.

The second function layer 15 is located at a side of the crystalline silicon absorbing layer 13 away from the single-layer electrical function layer 11, and the second electrode 17 is penetrated through or at least partially inserted in the second function layer 15.

In the embodiments of the present disclosure, the second function layer 15 may serve as a lower function layer of the surface of the crystalline silicon absorbing layer 13, and is located at a side of the crystalline silicon absorbing layer 13 is away from the single-layer electrical function layer 11. The second function layer 15 is a multi-layer structure and may have at least one of functions such as interface passivation, selective contact and transmission, and lower surface anti-reflection. The second electrode 17 may be used as a lower electrode of the surface of the crystalline silicon absorbing layer 13, wherein the second electrode 17 may be made of a metal or an alloy such as aluminum, copper, silver, etc. Optionally, the second electrode 17 is penetrated through or at least partially inserted in the second function layer 15. For example, the second electrode 17 may be partially embedded in the second function layer 15, and may also be penetrated through the second function layer 15, thus carriers are led out to realize external output.

Optionally, the tandem photovoltaic device further includes at least one of a first interface passivation layer and a second interface passivation layer;

the thickness of the first interface passivation layer is less than or equal to 5 nm and the first interface passivation layer is located between the perovskite absorbing layer 12 and the single-layer electrical function layer 11; and the thickness of the second interface passivation layer is less than or equal to 5 nm, and the second interface passivation layer is located between the crystalline silicon absorbing layer 13 and the single-layer electrical function layer 11.

In the embodiments of the present disclosure, a first interface passivation layer may be disposed between the perovskite absorbing layer 12 and the single-layer electrical function layer 11, and/or a second interface passivation layer may be disposed between the crystalline silicon absorbing layer 13 and the single-layer electrical function layer 11. The material of the first interface passivation layer and the second interface passivation layer may be a dielectric material and have a thickness of less than or equal to 5 nm, so as to avoid excessive thickness affecting the electrical function.

The tandem photovoltaic device provided in the embodiments of the present disclosure includes a perovskite absorbing layer, a crystalline silicon absorbing layer, and a single-layer electrical function layer connected in series to the perovskite absorbing layer and the crystalline silicon absorbing layer, wherein the contact interface between the perovskite absorbing layer and the single-layer electrical function layer is a first series interface, and the contact interface between the crystalline silicon absorbing layer and the single-layer electrical function layer is a second series interface, wherein the conducting type of the crystalline silicon absorbing layer at the second series interface is different from the conducting type of the perovskite absorbing layer at the first series interface; and the difference between the work function of the crystalline silicon absorbing layer at the second series interface and the work function of the perovskite absorbing layer at the first series interface is $\geq -0.3$ eV and $\leq 0.3$ eV. The difference of the work functions between the perovskite absorbing layer and the crystalline silicon absorbing layer of the tandem photovoltaic device provided by the embodiment of the present disclosure at the contact interface is $\geq -0.3$ eV and $\leq 0.3$ eV. Therefore, that the work functions between the perovskite absorbing layer and the crystalline silicon absorbing layer are matched may be achieved to avoid the voltage loss caused by the mismatching of the work functions. Furthermore, based on the matching of the work functions, the energy band structures of the perovskite absorbing layer and the crystalline silicon absorbing layer are matched, without a need to perform energy level buffering. The single-layer electrical function layer may be used to connect the two absorbing layers in series, the parasitic absorption of multi-layer series is reduced. The resistance and interface loss induced by the interfaces between the multi-layers are reduced, and the current and voltage losses are reduced, so that the output voltage of the tandem photovoltaic device is improved, and the power conversion efficiency of the tandem photovoltaic device is further improved.

Embodiment 1

As shown in FIG. 1, the embodiments of the present disclosure provide a specific example of a tandem photovoltaic device, including that:

the first series interface 121 of the perovskite absorbing layer 12 is prepared by using a FAPbI$_3$ single-component perovskite material with a thickness of 300 nm-500 nm, and the first series interface 121 on the perovskite absorbing layer 12 is N-type by using an excessive amount of PbI$_2$ component during the deposition process; at this moment, the electrical conductivity of the perovskite absorbing layer 12 has the order of $10^{-7}$ s·cm$^{-1}$ much lower than that of crystalline silicon.

A first function layer 14 is disposed on the perovskite absorbing layer 12. The first function layer 14 has functions of interface passivation, hole selective contact and transmission, and upper surface anti-reflection, wherein the first function layer 14 is a multilayer structure, a calcium fluoride or lithium fluoride material with a thickness of 2 nm is used as an interface passivation layer, a stacked layer of nickel oxide with a thickness of 50 nm and the material of tin oxide with a thickness of 100 nm is used as a hole selective contact and transmission layer, and magnesium fluoride is used as an upper surface anti-reflection thin film.

A P-type silicon wafer is used for the crystalline silicon absorbing layer 13; a full-layer P-type heavily doped layer is generated at the second series interface 131 on the upper surface of the P-type silicon wafer by using a diffusion or ion implantation method; the doping concentration at the second series interface 131 is $5 \times 10^{18}$ cm$^{-3}$, the corresponding resistivity is $4 \times 10^{-2}$ Ω·cm, and the corresponding electrical conductivity (the reciprocal of the resistivity) is 25 s·cm$^{-1}$; and the upper and lower surfaces are in a planar structure.

The lower surface of the crystalline silicon absorbing layer 13 is provided with a second function layer 15, a passivation contact structure is adopted for the second function layer 15 and functions as interface passivation, electron selective contact and transmission and lower surface anti-reflection, wherein the second function layer 15 is a multilayer structure, respectively being a silicon oxide layer with a thickness of 2 nm, an N-type polycrystalline silicon layer with a thickness of 30 nm, an indium-doped tin oxide layer with a thickness of 100 nm and a silicon nitride thin film stack layer with a thickness of 80 nm.

A single-layer electrical function layer 11 is disposed between the perovskite absorbing layer 12 and the crystalline silicon absorbing layer 13, wherein the single-layer electrical function layer 11 is an indium tin oxide layer with a thickness of 30 nm; the electrical conductivity of the indium tin oxide may reach $10^4$ s·cm$^{-1}$, where lightly doped indium oxide is used, with less tin oxide doping, which is below 1 wt %.

The surfaces of the single-layer electrical function layer 11 and the crystalline silicon absorbing layer 13 are provided with an interfacial silicon oxide with a thickness of not more than 2 nm, so as to play a role in surface passivation effect on the crystalline silicon.

The upper surface of the first function layer 14 is provided with a corresponding first electrode 16, and the lower surface of the second function layer 15 is provided with a corresponding second electrode 17, wherein the first electrode 16 and the second electrode 17 may be made of metals or alloys such as aluminum, copper, silver, etc. and be penetrated through or at least partially inserted in the function layer in contact with the first electrode 16 and the second electrode 17, so as to realize external output.

Embodiment 2

Figure 4:
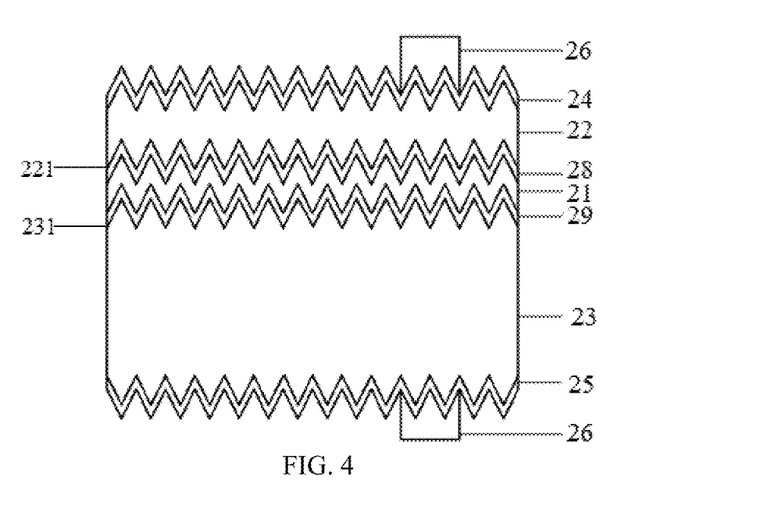
FIG. 4 shows a schematic diagram of a structure of another tandem photovoltaic device according to an embodiment of the present disclosure.

FIG. 4 shows a schematic diagram of a structure of another tandem photovoltaic device according to an embodiment of the present disclosure. As shown in FIG. 4, a specific example of another tandem photovoltaic device includes:

a single-layer electrical function layer 21, a perovskite absorbing layer 22, a crystalline silicon absorbing layer 23, a first function layer 24, a second function layer 25, a first electrode 26, a second electrode 27, a first interface passivation layer 28 and a second interface passivation layer 29.

The first series interface 221 of the perovskite absorbing layer 22 is prepared by using an MAPbI$_3$ single-component perovskite material with a thickness of 300 nm-500 nm, and the first series interface 221 of the perovskite absorbing layer 22 is N-type by using an excessive amount of PbI$_2$ component during the deposition process; and the resistivity of MAPbI$_3$ is 4 Ω·cm, and the electrical conductivity is 0.25 s·cm$^4$.

A first function layer 24 is disposed on the perovskite absorbing layer 22. The first function layer 24 has functions of interface passivation, hole selective contact and transmission, and upper surface anti-reflection, wherein the first function layer 24 is a multilayer structure; a calcium fluoride material with a thickness of 2 nm is used as an interface passivation layer; a stacked layer of Spiro-OMeTAD with a thickness of 50 nm and a material of tin oxide with a thickness of 100 nm is used as a hole selective contact and transmission layer; and magnesium fluoride is used as an upper surface anti-reflection thin film.

An N-type silicon wafer is used for the crystalline silicon absorbing layer 23; a P-type diffusion region is formed by thermal diffusion at the first series interface 231 of the upper surface of the N-type silicon wafer; and both the upper and lower surfaces are of a textured structure, wherein the doping concentration at the first series interface 121 is $1\times10^{19}$ cm$^{-3}$, and the electrical conductivity is 60 s·cm$^{-1}$.

The lower surface of the crystalline silicon absorbing layer 23 is provided with a second function layer 25, a heterojunction structure is adopted for the second function layer and functions as interface passivation, electron selective contact and transmission and lower surface anti-reflection, wherein the second function layer 25 is a multilayer structure, respectively being an intrinsic amorphous silicon with a thickness of 5 nm, an N-type amorphous silicon with a thickness of 20 nm, an indium-doped tin oxide layer with a thickness of 100 nm and a silicon nitride thin film stack layer with a thickness of 80 nm.

A single-layer electrical function layer 21 is disposed between the perovskite absorbing layer 22 and the crystalline silicon absorbing layer 23; the single-layer electrical function layer 21 is prepared by using an aluminum-doped zinc oxide material and has a thickness of 20 nm; the electrical conductivity of the aluminum-doped zinc oxide layer is generally 100 s·cm$^{-1}$.

A first interface passivation layer 28 is disposed between the perovskite absorbing layer 22 and the single-layer electrical function layer 21, and is made of a material of lithium fluoride with a thickness of 1 nm.

A second interface passivation layer 29 is disposed between the crystalline silicon absorbing layer 23 and the single-layer electrical function layer 21; a silicon oxide layer with a thickness of 2 nm is used to realize surface passivation on the crystalline silicon.

The upper surface of the first function layer 24 is provided with a corresponding first electrode 26, and the lower surface of the second function layer 25 is provided with a corresponding second electrode 27, wherein the first-electrode 26 and the second electrode 27 may be made of metals or alloys such as aluminum, copper, silver, etc. and be penetrated through or at least partially inserted in the function layer in contact with the first electrode 26 and the second electrode 27, so as to realize external output.

Embodiment 3

Figure 5:
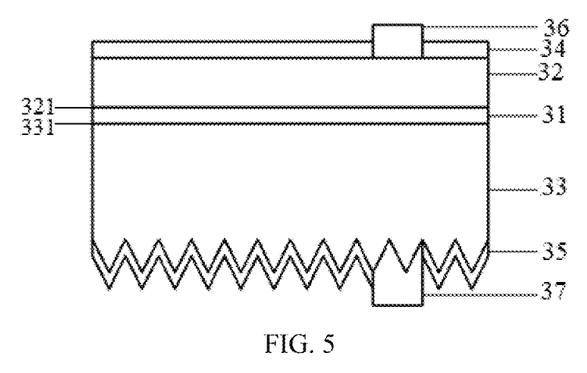
FIG. 5 shows a schematic diagram of a structure of yet another tandem photovoltaic device according to an embodiment of the present disclosure.

FIG. 5 shows a schematic diagram of a structure of yet another tandem photovoltaic device according to an embodiment of the present disclosure. As shown in FIG. 5, a specific example of yet another tandem photovoltaic device includes:
a single-layer electrical function layer 31, a perovskite absorbing layer 32, a crystalline silicon absorbing layer 33, a first function layer 34, a second function layer 35, a first electrode 36 and a second electrode 37.

The first series interface 321 of the perovskite absorbing layer 32 is prepared by using a perovskite material with a blend component of MASnBr$_3$ and FASnI$_3$ with a thickness of 300 nm-500 nm; in the deposition process, the first series interface 321 of the perovskite absorbing layer 32 is P-type by using an excessive amount of MAI and FAI components; and the electrical conductivity corresponding to mixed perovskites is of the order of $10^{-3}$ s·cm$^{-1}$.

A first function layer 34 is disposed on the perovskite absorbing layer 32. The first function layer 34 has the functions of selective contact and transmission of electrons and upper surface anti-reflection, wherein the first function layer 34 is a multi-layer structure. A stacked layer of C$_{60}$ with a thickness of 10 nm, tin oxide with a thickness of 20 nm and the material of aluminum-doped tin oxide with a thickness of 80 nm is used as a hole selective contact and transmission layer. Magnesium fluoride is used as an upper surface anti-reflection film.

An N-type silicon wafer is used for the crystalline silicon absorbing layer 33. The doping concentration is $1\times10^{16}$ cm$^3$, the electrical conductivity is 2 s·cm$^{-1}$, and the second series interface 331 of the lower surface of the crystalline silicon absorbing layer 33 is a textured structure and has a P-type region obtained by diffusion or ion implantation doping. The upper surface is a planar structure.

The lower surface of the crystalline silicon absorbing layer 33 is provided with a second function layer 35. The second function layer 35 and the crystalline silicon absorbing layer 33 form a PERT (passivated emitter rear totally-diffused cell) back surface structure, serving the functions of interface passivation and lower surface anti-reflection. The second function layer 35 is a multilayer structure, respectively being a silicon oxide with a thickness of 3 nm, an aluminum oxide with a thickness of 35 nm and a silicon nitride thin film stack layer with a thickness of 80 nm.

A single-layer electrical function layer 31 is disposed between the perovskite absorbing layer 32 and the crystalline silicon absorbing layer 33 and is made of a nickel oxide material, with a thickness of 50 nm. The electrical conductivity of the un-doped nickel oxide is 5 s·cm$^{-1}$, meeting the requirement.

The upper surface of the first function layer 34 is provided with a corresponding first electrode 36, and the lower surface of the second function layer 35 is provided with a corresponding second electrode 37, wherein the first electrode 36 and the second electrode 37 may be made of metals or alloys such as aluminum, copper, silver, etc. and be penetrated through or at least partially inserted in the function layer in contact with the first electrode 36 and the second electrode 77, so as to realize external output.

The tandem photovoltaic device provided in the embodiments of the present disclosure is a two-terminal two-junction structure of crystalline silicon and perovskite. The work functions of the perovskite absorbing layer of the upper cell and the crystalline silicon absorbing layer of the lower cell are matched by adjusting the work function of the perovskite absorbing layer of the upper cell at the series interface, thereby the voltage loss at the series interface of the upper and lower cells due to energy level mismatch is reduced. At the same time, since the absorbing layers of the upper and lower cells have a matched work function at the series interface, the intermediate series structure does not need a multi-layer function layer structure for energy band buffering, and a single-layer electrical function layer may realize the series connection of the upper and lower cells, the number of layers of the series structure is reduced, thereby free carrier parasitic absorption caused by the introduction of the multi-layer electrical function layer is reduced, and the quantity of interfaces is also reduced, thereby the transmission loss caused by interface resistance and defects are reduced.

In summary, the tandem photovoltaic device provided in the present disclosure may effectively reduce the voltage and current loss of the tandem photovoltaic device and improve the overall efficiency of the tandem photovoltaic device by adjusting the matching of the work functions of the absorbing layers of the upper and lower cells at the series interface and using the single-layer electrical function layer serial structure on this basis, and may be applied to upper and lower cells of various structures.

It should be noted that, the term "includes", "includes" or any other variation thereof herein is intended to cover non-exclusive inclusion, so that a process, method, goods or device that includes a set of elements includes not only those elements but also other elements not explicitly listed, or include elements inherent to the process, method, object, or device. In the absence of further restrictions, the limited element stated by "including a . . . " does not preclude the existence of another identical element in a process, method, goods or device that includes the element.

The embodiments of the present disclosure have been described above with reference to the accompanying drawings, but the present disclosure is not limited to the specific embodiments described above, which are intended to be illustrative only and not limiting. There are many other forms that may be made by those of ordinary skill in the art, inspired by the present disclosure, without departing from the purposes and the scope protected by claims of the present disclosure, all of which are within the protection of the present disclosure.

The invention claimed is:

1. A tandem photovoltaic device, wherein the tandem photovoltaic device comprises a perovskite absorbing layer, a crystalline silicon absorbing layer, and a single-layer electrical function layer connected in series to the perovskite absorbing layer and the crystalline silicon absorbing layer, a contact interface between the perovskite absorbing layer and the single-layer electrical function layer is a first series interface, and a contact interface between the crystalline silicon absorbing layer and the single-layer electrical function layer is a second series interface:
   wherein a conducting type of the crystalline silicon absorbing layer at the second series interface is different from a conducting type of the perovskite absorbing layer at the first series interface; and
   a difference between a work function of the crystalline silicon absorbing layer at the second series interface and a work function of the perovskite absorbing layer at the first series interface is ≥−0.3 eV and ≤0.3 eV.

2. The tandem photovoltaic device according to claim 1, wherein a work function of the single-layer electrical function layer is located within a range between a first work function and a second work function and including the first work function and the second work function:
   the first work function is a work function of the perovskite absorbing layer at the first series interface on the perovskite absorbing layer; and
   the second work function is a work function of the crystalline silicon absorbing layer at the second series interface on the crystalline silicon absorbing layer.

3. The tandem photovoltaic device according to claim 1, wherein an electrical conductivity of the single-layer electrical function layer is greater than or equal to a maximum of a first electrical conductivity and a second electrical conductivity:
   the first electrical conductivity is an electrical conductivity of the perovskite absorbing layer at the first series interface on the perovskite absorbing layer; and
   the second electrical conductivity is an electrical conductivity of the crystalline silicon absorbing layer at the second series interface on the crystalline silicon absorbing layer.

4. The tandem photovoltaic device according to claim 1, wherein a band gap width of a perovskite material used for the perovskite absorbing layer is 1.5 eV to 2.3 eV.

5. The tandem photovoltaic device according to claim 1, wherein the tandem photovoltaic device further comprises at least one of a first interface passivation layer and a second interface passivation layer;
   a thickness of the first interface passivation layer is less than or equal to 5 nm, and the first interface passivation layer is located between the perovskite absorbing layer and the single-layer electrical function layer; and
   a thickness of the second interface passivation layer is less than or equal to 5 nm, and the second interface passivation layer is located between the crystalline silicon absorbing layer and the single-layer electrical function layer.

6. The tandem photovoltaic device according to claim 1, wherein the tandem photovoltaic device further comprises a first function layer, a second function layer, a first electrode and a second electrode;
   the first function layer is located at a side of the perovskite absorbing layer away from the single-layer electrical function layer; and the first electrode is penetrated through or at least partially inserted in the first function layer; and
   the second function layer is located at a side of the crystalline silicon absorbing layer away from the single-layer electrical function layer; and the second electrode is penetrated through or at least partially inserted in the second function layer.

7. The tandem photovoltaic device according to claim 1, wherein the conducting type of the crystalline silicon absorbing layer at the second series interface is P-type: an N-type perovskite material is used at the first series interface on the perovskite absorbing layer, wherein the perovskite material comprises at least one of $FAPbI_3$, $MAPb_{1.1}I_{3.2}$, $MAPb_{1.5}Br_4$, $MASnI_3$, $MAPbBr_{1.5}Cl_{1.5}$, $MAPbCl_3$, $MAPbI_3$, $MAPbI_{2.1}Cl_{0.9}$, $FASnI_3$ and $CsSnI_3$; and
   an N-type dopant is further employed at the first series interface on the perovskite absorbing layer, wherein the N-type dopant comprises at least one of indium, antimony, vanadium and bismuth.

8. The tandem photovoltaic device according to claim 7, wherein a material used for the single-layer electrical function layer comprises any one or a doped material of any one of tin oxide, nickel oxide, copper oxide, molybdenum oxide, 2,2',7,7'-tetrakis [N,N-di(4-methoxyphenyl)amino]-9,9'-spirobifluorene, cuprous oxide, tungsten oxide, vanadium oxide, poly[bis(4-phenyl) (2,4,6-trimethylphenyl)amine], cuprous thiocyanate, poly(3,4-ethylene dioxy thiophene), poly(3,4-ethylene dioxy thiophene)-polystyrene sulfonic acid; and
   the doped material is obtained by doping with any one of an alkali metal element, an alkaline earth metal element, a transition metal element and a halogen metal element.

9. The tandem photovoltaic device according to claim 1, wherein the conducting type of the crystalline silicon absorbing layer at the second series interface is N-type: a P-type perovskite material is used at the first series interface on the perovskite absorbing layer, wherein the P-type perovskite material comprises at least one of $MAPbBr_3$, $MAPb_{0.91}I_{2.82}$, $MAPbI_3$, $FAPbI_3$, $MASnI_3$, $MANH_3PbI_3$, $MASnBr_3$, $FASnI_3$ and $CsSnBr_3$; and a P-type dopant is further employed at the first series interface on the perovskite absorbing layer, wherein the P-type dopant comprises at least one of sodium, potassium, copper and oxygen.

10. The tandem photovoltaic device according to claim 9, wherein a material used for the single-layer electrical function layer comprises any one or a doped material of any one of zinc oxide, indium oxide, tin oxide, titanium oxide, molybdenum sulfide, niobium oxide, tantalum oxide, cadmium sulfide and fullerene carbon; and the doped material is obtained by doping with any one of an alkali metal element, an alkaline earth metal element, a transition metal element and a halogen metal element.

* * * * *